(12) United States Patent
Kim et al.

(10) Patent No.: US 9,837,585 B2
(45) Date of Patent: Dec. 5, 2017

(54) LIGHT EMITTING DEVICE

(71) Applicant: LUMIMICRO CORP. LTD., Yongin-si, Gyeonggi-do (KR)

(72) Inventors: Tae Hun Kim, Changwon-si (KR); Sang Il Lee, Osan-si (KR); Sang Jae Lee, Osan-si (KR); Bong Yull Choi, Gwangmyeong-si (KR); Byung Joo Ji, Suwon-si (KR); Je Eun Hwang, Osan-si (KR)

(73) Assignee: LUMIMICRO CORP. LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/035,378

(22) PCT Filed: Apr. 25, 2014

(86) PCT No.: PCT/KR2014/003664
§ 371 (c)(1),
(2) Date: May 9, 2016

(87) PCT Pub. No.: WO2015/068916
PCT Pub. Date: May 14, 2015

(65) Prior Publication Data
US 2016/0293808 A1 Oct. 6, 2016

(30) Foreign Application Priority Data

Nov. 8, 2013 (KR) .......................... 10-2013-0135280
Apr. 25, 2014 (KR) .......................... 10-2014-0049845

(51) Int. Cl.
*H01L 33/50* (2010.01)
*C09K 11/00* (2006.01)

(52) U.S. Cl.
CPC ............ *H01L 33/504* (2013.01); *C09K 11/00* (2013.01); *H01L 33/502* (2013.01)

(58) Field of Classification Search
None
See application file for complete search history.

(56) References Cited

U.S. PATENT DOCUMENTS

| | | | |
|---|---|---|---|
| 6,621,211 | B1 | 9/2003 | Srivastava et al. |
| 6,939,481 | B2 | 9/2005 | Srivastava et al. |

(Continued)

FOREIGN PATENT DOCUMENTS

| | | |
|---|---|---|
| JP | 2005-340748 A | 12/2005 |
| JP | 4963705 B2 | 6/2012 |

(Continued)

OTHER PUBLICATIONS

Japanese Office Action dated Jan. 10, 2017.

*Primary Examiner* — Angel Roman
*Assistant Examiner* — Kevin Quinto
(74) *Attorney, Agent, or Firm* — Rabin & Berdo, P.C.

(57) ABSTRACT

Disclosed is a light-emitting device which comprises: a light-emitting element for emitting a first light in a blue wavelength band; a first wavelength converter for converting the first light into a second light; a second wavelength converter for converting the first light into a third light; and a third wavelength converter for converting the first light into a fourth light, wherein the first to fourth lights have central wavelengths which satisfy the following relationship: [Expression 1] $\lambda_1 < \lambda_2 < \lambda_3 < \lambda_4$ (wherein $\lambda_1$ is the central wavelength of the first light; $\lambda_2$ is the central wavelength of the second light; $\lambda_3$ is the central wavelength of the third light; and $\lambda_4$ is the central wavelength of the fourth light.).

6 Claims, 20 Drawing Sheets

(56) References Cited

U.S. PATENT DOCUMENTS

| | | |
|---|---|---|
| 8,054,970 B2 | 11/2011 | Kimura et al. |
| 8,162,506 B2 | 4/2012 | Wei et al. |
| 8,471,459 B2 | 6/2013 | Kato et al. |
| 2004/0007961 A1 | 1/2004 | Srivastava et al. |
| 2005/0156496 A1* | 7/2005 | Takashima ......... C09K 11/0883 313/237 |
| 2009/0146549 A1* | 6/2009 | Kimura .............. C09K 11/7734 313/503 |
| 2010/0157572 A1 | 6/2010 | Wei et al. |
| 2012/0056528 A1 | 3/2012 | Kato et al. |

FOREIGN PATENT DOCUMENTS

| | | |
|---|---|---|
| JP | 2013-047347 A | 3/2013 |
| KR | 10-2013-0057354 A | 5/2013 |
| WO | WO 2008/020541 A1 | 2/2008 |

\* cited by examiner

| Cx | Cy | CCT | CRI | R1 | R2 | R3 | R4 | R5 | R6 |
|---|---|---|---|---|---|---|---|---|---|
| 0.339 | 0.356 | 5209 | 94 | 96 | 94 | 93 | 93 | 95 | 92 |
| R7 | R8 | R9 | R10 | R11 | R12 | R13 | R14 | R15 | |
| 93 | 94 | 85 | 88 | 93 | 85 | 95 | 97 | 94 | |

| Cx | Cy | CCT | CRI | R1 | R2 | R3 | R4 | R5 | R6 |
|---|---|---|---|---|---|---|---|---|---|
| 0.340 | 0.357 | 5203 | 97 | 99 | 97 | 96 | 94 | 98 | 96 |
| R7 | R8 | R9 | R10 | R11 | R12 | R13 | R14 | R15 | |
| 96 | 97 | 95 | 95 | 93 | 90 | 98 | 98 | 98 | |

| Cx | Cy | CCT | CRI | R1 | R2 | R3 | R4 | R5 | R6 |
|---|---|---|---|---|---|---|---|---|---|
| 0.335 | 0.347 | 5371 | 96 | 96 | 99 | 97 | 90 | 95 | 98 |
| R7 | R8 | R9 | R10 | R11 | R12 | R13 | R14 | R15 | |
| 95 | 93 | 86 | 96 | 87 | 99 | 97 | 98 | 95 | |

| Cx | Cy | CCT | CRI | R1 | R2 | R3 | R4 | R5 | R6 |
|---|---|---|---|---|---|---|---|---|---|
| 0.346 | 0.363 | 4969 | 92 | 94 | 93 | 93 | 91 | 93 | 91 |
| R7 | R8 | R9 | R10 | R11 | R12 | R13 | R14 | R15 | |
| 91 | 91 | 85 | 84 | 94 | 80 | 93 | 96 | 92 | |

| Cx | Cy | CCT | CRI | R1 | R2 | R3 | R4 | R5 | R6 |
|---|---|---|---|---|---|---|---|---|---|
| 0.440 | 0.407 | 2968 | 98 | 97 | 100 | 97 | 95 | 97 | 98 |
| R7 | R8 | R9 | R10 | R11 | R12 | R13 | R14 | R15 | |
| 99 | 99 | 99 | 99 | 92 | 97 | 98 | 97 | 99 | |

| Cx | Cy | CCT | CRI | R1 | R2 | R3 | R4 | R5 | R6 |
|---|---|---|---|---|---|---|---|---|---|
| 0.307 | 0.328 | 6769 | 97 | 97 | 97 | 97 | 97 | 97 | 95 |
| R7 | R8 | R9 | R10 | R11 | R12 | R13 | R14 | R15 | |
| 98 | 97 | 91 | 94 | 95 | 81 | 97 | 99 | 96 | |

| Cx | Cy | CCT | CRI | R1 | R2 | R3 | R4 | R5 | R6 |
|---|---|---|---|---|---|---|---|---|---|
| 0.339 | 0.350 | 5249 | 96 | 96 | 98 | 95 | 98 | 96 | 95 |
| R7 | R8 | R9 | R10 | R11 | R12 | R13 | R14 | R15 | |
| 96 | 96 | 97 | 99 | 96 | 67 | 96 | 96 | 94 | |

| Cx | Cy | CCT | CRI | R1 | R2 | R3 | R4 | R5 | R6 |
|---|---|---|---|---|---|---|---|---|---|
| 0.340 | 0.353 | 5197 | 93 | 93 | 96 | 95 | 91 | 91 | 91 |
| R7 | R8 | R9 | R10 | R11 | R12 | R13 | R14 | R15 | |
| 95 | 90 | 74 | 88 | 90 | 66 | 95 | 97 | 92 | |

| Cx | Cy | CCT | CRI | R1 | R2 | R3 | R4 | R5 | R6 |
|---|---|---|---|---|---|---|---|---|---|
| 0.337 | 0.357 | 5299 | 96 | 96 | 98 | 99 | 94 | 95 | 96 |
| R7 | R8 | R9 | R10 | R11 | R12 | R13 | R14 | R15 | |
| 96 | 94 | 87 | 96 | 96 | 75 | 97 | 100 | 94 | |

| Cx | Cy | CCT | CRI | R1 | R2 | R3 | R4 | R5 | R6 |
|---|---|---|---|---|---|---|---|---|---|
| 0.342 | 0.353 | 5112 | 93 | 93 | 93 | 94 | 93 | 93 | 91 |
| R7 | R8 | R9 | R10 | R11 | R12 | R13 | R14 | R15 | |
| 92 | 92 | 82 | 84 | 95 | 78 | 92 | 96 | 91 | |

| Cx | Cy | CCT | CRI | R1 | R2 | R3 | R4 | R5 | R6 |
|---|---|---|---|---|---|---|---|---|---|
| 0.339 | 0.356 | 5209 | 94 | 96 | 94 | 93 | 93 | 95 | 92 |
| R7 | R8 | R9 | R10 | R11 | R12 | R13 | R14 | R15 | |
| 93 | 94 | 85 | 88 | 93 | 85 | 95 | 97 | 94 | |

| Cx | Cy | CCT | CRI | R1 | R2 | R3 | R4 | R5 | R6 |
|---|---|---|---|---|---|---|---|---|---|
| 0.335 | 0.347 | 5371 | 96 | 96 | 99 | 97 | 90 | 95 | 98 |
| R7 | R8 | R9 | R10 | R11 | R12 | R13 | R14 | R15 | |
| 95 | 93 | 86 | 96 | 87 | 99 | 97 | 98 | 95 | |

| Cx | Cy | CCT | CRI | R1 | R2 | R3 | R4 | R5 | R6 |
|---|---|---|---|---|---|---|---|---|---|
| 0.344 | 0.365 | 5004 | 95 | 96 | 95 | 93 | 94 | 96 | 93 |
| R7 | R8 | R9 | R10 | R11 | R12 | R13 | R14 | R15 | |
| 94 | 95 | 91 | 86 | 93 | 88 | 95 | 96 | 95.22 | |

| Cx | Cy | CCT | CRI | R1 | R2 | R3 | R4 | R5 | R6 |
|---|---|---|---|---|---|---|---|---|---|
| 0.337 | 0.357 | 5299 | 96 | 96 | 98 | 99 | 94 | 95 | 96 |
| R7 | R8 | R9 | R10 | R11 | R12 | R13 | R14 | R15 | |
| 96 | 94 | 87 | 96 | 96 | 75 | 97 | 100 | 94 | |

| Cx | Cy | CCT | CRI | R1 | R2 | R3 | R4 | R5 | R6 |
|---|---|---|---|---|---|---|---|---|---|
| 0.347 | 0.368 | 5004 | 91 | 92 | 92 | 91 | 91 | 92 | 89 |
| R7 | R8 | R9 | R10 | R11 | R12 | R13 | R14 | R15 | |
| 93 | 92 | 79 | 79 | 88 | 87 | 91 | 94 | 92.36 | |

| Cx | Cy | CCT | CRI | R1 | R2 | R3 | R4 | R5 | R6 |
|---|---|---|---|---|---|---|---|---|---|
| 0.346 | 0.363 | 4969 | 92 | 94 | 93 | 93 | 91 | 93 | 91 |
| R7 | R8 | R9 | R10 | R11 | R12 | R13 | R14 | R15 | |
| 91 | 91 | 85 | 84 | 94 | 80 | 93 | 96 | 92 | |

| Cx | Cy | CCT | CRI | R1 | R2 | R3 | R4 | R5 | R6 |
|---|---|---|---|---|---|---|---|---|---|
| 0.3388 | 0.355 | 5229.9 | 96.5 | 97.1 | 96.4 | 96.2 | 96.2 | 97.1 | 95.9 |
| R7 | R8 | R9 | R10 | R11 | R12 | R13 | R14 | R15 | |
| 95.2 | 95.9 | 94.1 | 91.4 | 97.5 | 82.7 | 96.3 | 97.6 | 95.1 | |

| Cx | Cy | CCT | CRI | R1 | R2 | R3 | R4 | R5 | R6 |
|---|---|---|---|---|---|---|---|---|---|
| 0.342 | 0.353 | 5112 | 93 | 93 | 93 | 94 | 93 | 93 | 91 |
| R7 | R8 | R9 | R10 | R11 | R12 | R13 | R14 | R15 | |
| 92 | 92 | 82 | 84 | 95 | 78 | 92 | 96 | 91 | |

| Cx | Cy | CCT | CRI | R1 | R2 | R3 | R4 | R5 | R6 |
|---|---|---|---|---|---|---|---|---|---|
| 0.3421 | 0.3531 | 5094.3 | 87.7 | 86.4 | 87.8 | 89.0 | 88.2 | 86.8 | 84.4 |
| R7 | R8 | R9 | R10 | R11 | R12 | R13 | R14 | R15 | |
| 91.1 | 86.2 | 61.1 | 70.0 | 84.7 | 79.4 | 85.8 | 93.4 | 85.0 | |

FIG. 39

LIGHT EMITTING DEVICE

TECHNICAL FIELD

The present invention relates to a light emitting device in which a color rendering index is improved.

BACKGROUND ART

A light emitting diode (LED) is a device in which a compound semiconductor such as GaAs, AlGaAs, GaN, and InGaInP is coated with a phosphor, and emits light having various colors. The LED converts a wavelength of light emitted from a light emitting diode (LED) to that of a required color using an outside phosphor.

Conventionally, a method which converts a wavelength of light of a blue LED to that of white light using a yellow color phosphor has been used. The white LED having such a structure has been widely used because it has a low cost and is structurally simple in principle.

However, there is a problem in which a color rendering index (CRI) is low because of lack of a spectrum of green and red due to the emission of a single yellow phosphor.

The CRI is an index which evaluates how well an object of unique color is seen as a suitable natural color in light of a light source. Such a CRI includes a general CRI Ra which is an average value averaged by eight colors of R1 to R8 set, and special CRIs R9 to R15. Such special CRIs include R9 as red, R10 as yellow, R12 as blue, and the like.

Recently, a technology in which the CRI is improved by mixing a red phosphor, a green phosphor, or the like as well as the yellow phosphor has been developed. However, although such a technology improves the general CRI Ra, there is a problem in that the value of R12 (blue) among the special CRIs is still low.

DISCLOSURE

Technical Problem

The present invention is directed to providing a light emitting device which generates white light, and improves a value of R12 as well as a general color rendering index.

Technical Solution

One aspect of the present invention provides a light emitting device including a light emitting element which emits a first light beam having a blue wavelength band; a first wavelength converter which converts the first light beam to a second light beam; a second wavelength converter which converts the first light beam to a third light beam; and a third wavelength converter which converts the first light beam to a fourth light beam, wherein central wavelengths of the first to fourth light beams satisfy following Expression 1.

$$\lambda 1 < \lambda 2 < \lambda 3 < \lambda 4 \quad \text{[Expression 1]}$$

(Here, $\lambda 1$ is the central wavelength of the first light beam, $\lambda 2$ is the central wavelength of the second light beam, $\lambda 3$ is the central wavelength of the third light beam, and $\lambda 4$ is the central wavelength of the fourth light beam.)

The second light beam may have the central wavelength in a range of 480 to 500 nm, and the central wavelength of the third light beam may be in a range of 510 to 550 nm.

Emitting light in which the first to fourth light beams are mixed may be white light, and a CRI value of R12 may be 80 or more.

Advantageous Effects

According to an exemplary embodiment of the present invention, a light emitting device which generates white light and shows natural blue by improving a value of R12 as well as improving a general color rendering index can be manufactured.

DESCRIPTION OF DRAWINGS

FIG. 39 is a table of measured values of color coordinates and CRI of the mixed light according to Comparative Example 8.

MODES OF THE INVENTION

Figure 1:
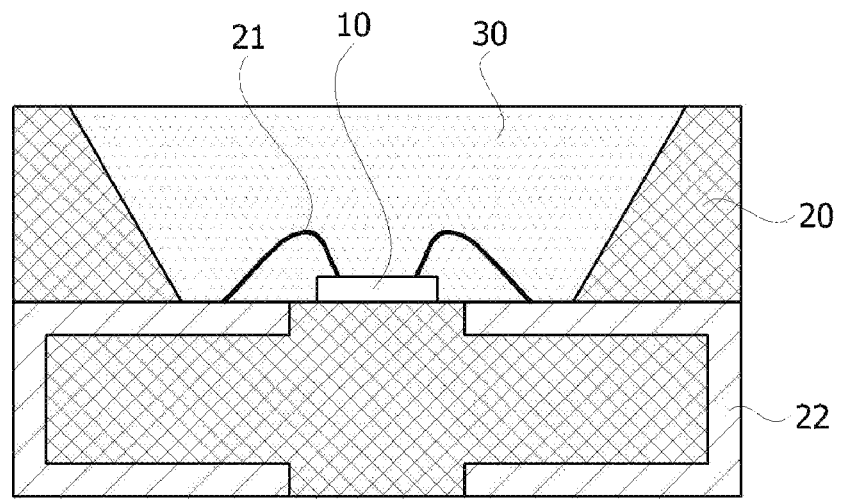
FIG. 1 is a schematic view illustrating a light emitting device according to one embodiment of the present invention.

While the invention can be modified in various ways and take on various alternative forms, specific embodiments thereof are shown in the drawings and described in detail below as examples.

However, there is no intent to limit the invention to the particular forms disclosed. On the contrary, the invention is to cover all modifications, equivalents, and alternatives falling within the spirit and scope of the appended claims.

In the present specification, it should be understood that terms such as "including", "having", and "comprising" are intended to indicate the existence of the features, numbers, steps, actions, components, parts, or combinations thereof disclosed in the specification, and are not intended to preclude the possibility that one or more other features, numbers, steps, actions, components, parts, or combinations thereof may exist or may be added.

Furthermore, it should be understood that sizes of components in the drawings in the present specification may be exaggerated for convenience of explanation.

Hereinafter, embodiments of the invention will be described in detail with reference to the accompanying drawings, like reference numerals are used for the same or corresponding components regardless of symbols of the drawings, and redundant description thereof will be omitted.

FIG. 1 is a schematic view illustrating a light emitting device according to one embodiment of the present invention.

Referring to FIG. 1, a light emitting device according to an embodiment of the present invention includes a light emitting element 10 which emits a first light having a blue wavelength band, a housing 20 on which the light emitting element is seated, and a phosphor 30 filled in the housing.

The light emitting element 10 emits blue light having a central wavelength in the range of 420 to 470 nm. Although various light sources (a light emitting diode (LED), an organic light emitting diode (OLED), and the like) may be selected as such a light emitting element, the light emitting element of the present embodiment of the present invention may be a nitride-based compound semiconductor having a quantum well structure.

The housing 20 has an opening in which the light emitting element 10 is mounted and supplies power to the light emitting element 10 through electrodes 22 connected to the external power source and wires 21. However, the housing 20 is not limited thereto, and when the light emitting element 10 is a flip chip type, the wires may also be omitted. The phosphor 30 (hereinafter, a wavelength converter) is mixed with a resin and filled in the opening of the housing 20.

The wavelength converter 30 according to the embodiment of the present invention includes a first wavelength converter which absorbs blue light and converts the blue light to light having a blue-green wavelength band, a second wavelength converter which absorbs blue light and converts the blue light to light having a yellow-green wavelength band, and a third wavelength converter which absorbs blue light and converts the blue light to light having a red wavelength band.

The first wavelength converter may be expressed with the following Equation 1 or Equation 3.

$$M_{x(1-p)}Si_yO_zN_{(2x+4y-2z)/3}:Eu^{2+} \qquad \text{[Equation 1]}$$

Here, M is at least one element selected from Ca, Sr, and Ba, x is in the range of 0.7 to 1.2, y is in the range of 1.5 to 2.6, z is in the range of 1.5 to 2.6, and p is in the range of 0 to 0.11.

$$BaSi_x(O,Cl)N_x:Eu^{2+} \ (0<x\leq2) \qquad \text{[Equation 3]}$$

The first wavelength converter absorbs blue light and emits blue-green light having a central wavelength in the range of 480 to 500 nm. Accordingly, an intensity of the blue light may be reinforced by the light converted by the first wavelength converter.

The second wavelength converter may be expressed with the following Equation 2 or Equation 4.

$$M_3Al_5O_{12}:Ce^{3+} \qquad \text{[Equation 2]}$$

Here, M is at least one element selected from Y, Lu, Sc, La, Gd, and Sm.

$$(Lu_x,Ce_{1-x})_3Al_5O_{12} \ (0<X<1) \qquad \text{[Equation 4]}$$

The second wavelength converter of the embodiment of the present invention may preferably be $Lu_3Al_5O_{12}:Ce^{3+}$, but it is not limited thereto. The second wavelength converter absorbs blue light and emits yellow-green light having a central wavelength in the range of 510 to 550 nm.

In addition, the third wavelength converter includes a $Ca_1Al_1Si_1N_3:Eu$, and absorbs blue light and emits red light having a central wavelength in the range of 600 to 700 nm.

Accordingly, a part of first light emitted from the light emitting element 10, second light converted by the first wavelength converter, third light converted by the second wavelength converter, and fourth light converted by the third wavelength converter are mixed, and then white light on a coordinate system of International Commission on Illumination (CIE) is generated. Here, the first light and the fourth light satisfy the following Expression 1.

$$\lambda 1 < \lambda 2 < \lambda 3 < \lambda \quad \text{[Expression 1]}$$

Here, $\lambda 1$ is a central wavelength of the first light, $\lambda 2$ is a central wavelength of the second light, $\lambda 3$ is a central wavelength of the third light, and $\lambda 4$ is a central wavelength of the fourth light.

According to the embodiment of the present invention, a general CRI Ra (R1 to R8) and special CRIs (R9 to R15) of white light may be maintained at 80 or more. Particularly, since blue light is reinforced by blue-green light converted by the first wavelength converter, a CRI value of R12 may be maintained at 80 or more. Accordingly, color expressiveness of blue becomes excellent.

Hereinafter, the light emitting device according to the embodiment of the present invention will be described specifically. However, the embodiments of the present invention are for helping understanding, and the scope of the present invention is not limited thereto.

First Embodiment

Figure 2:
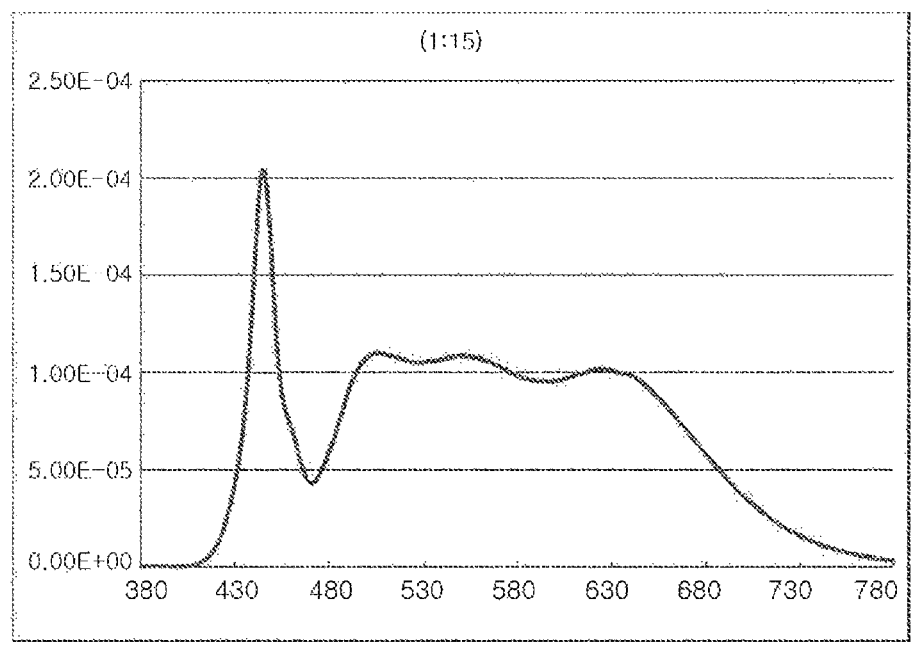
FIG. 2 is a graph showing an excitation spectrum of mixed light according to a first embodiment.

A compound phosphor at 12.5 wt % and a sealing material at 87.5 wt % were mixed and coated on a blue LED chip with a size of 1000 μm×500 μm and a peak wavelength of 446.3 nm. The compound phosphor was manufactured by mixing a first phosphor ($BaSi_2O_2N_2:Eu^{2+}$) having a peak wavelength of 497 nm at 5.4 wt %, a second phosphor ($Lu_3Al_5O_{12}:Ce^{3+}$) having a peak wavelength of 520 nm at 80.7 wt %, and a third phosphor ($CaAlSiN_3$) having a peak wavelength of 650 nm at 13.9 wt % into the sealing material. Here, ratios of the phosphors were calculated based on 100 wt %. The ratio of the first phosphor to the second phosphor was 1:15. A spectrum of light emitted from a manufactured white LED is illustrated in FIG. 2, and a CRI evaluation table is illustrated in FIG. 3.

Figures 3, 4:
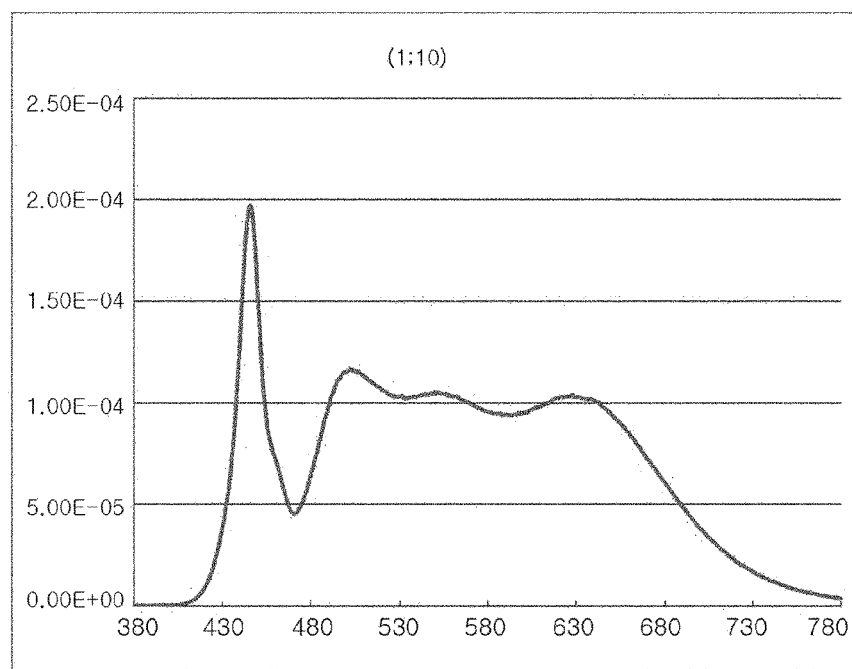
FIG. 3 is a table of measured values of color coordinates and color rendering index (CRI) of the mixed light according to the first embodiment.
FIG. 4 is a graph showing an excitation spectrum of mixed light according to a second embodiment.

Referring to FIG. 3, all CRI values of R1 to R15 were 80 or more, and R12 was measured to be a very high value of 85.

Second Embodiment

A compound phosphor at 13.3 wt % and a sealing material at 86.7 wt % were mixed and coated on a blue LED chip with a size of 1000 μm×500 μm and a peak wavelength of 446.3 nm. The compound phosphor was manufactured by mixing a first phosphor ($BaSi_2O_2N_2:Eu^{2+}$) having a peak wavelength of 497 nm at 7.7 wt, a second phosphor ($Lu_3Al_5O_{12}:Ce^{3+}$) having a peak wavelength of 520 nm at 76.9 wt %, and a third phosphor ($CaAlSiN_3$) having a peak wavelength of 650 nm at 15.4 wt % into the sealing material. Here, a ratio of the first phosphor to the second phosphor was 1:10.

Figures 5, 6:
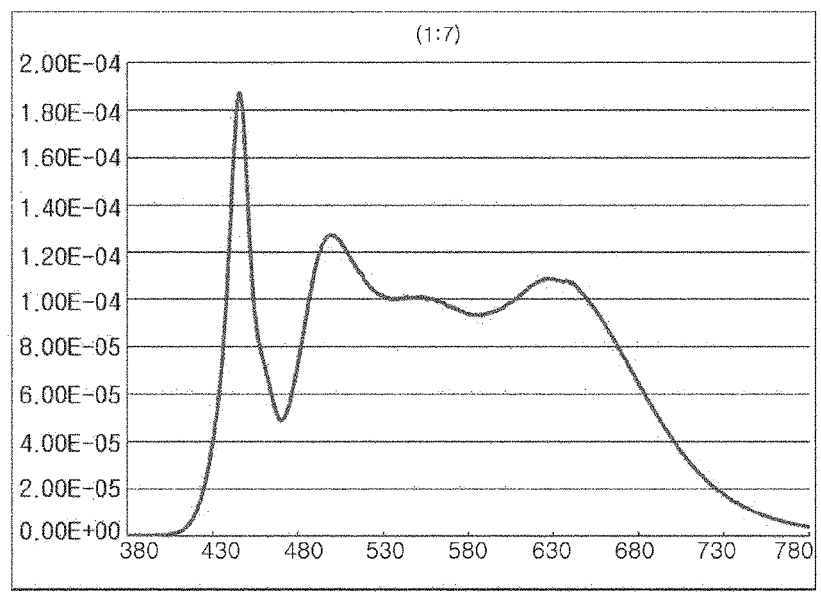
FIG. 5 is a table of measured values of color coordinates and CRI of the mixed light according to the second embodiment.
FIG. 6 is a graph showing an excitation spectrum of mixed light according to a third embodiment.

A spectrum of light emitted from the manufactured white LED is illustrated in FIG. 4, and a CRI evaluation table is illustrated in FIG. 5. Referring to FIG. 5, all CRI values of R1 to R15 were measured as 90 or more, and thus the CRI was greatly improved.

Third Embodiment

A compound phosphor at 13.9 wt % and a sealing material at 86.1 wt % were mixed and coated on a blue LED chip with a size of 1000 μm×500 μm and a peak wavelength of 446.9 nm. The compound phosphor was manufactured by mixing a first phosphor ($BaSi_2O_2N_2:Eu^{2+}$) having a peak wavelength of 497 nm at 10.5 wt %, a second phosphor ($Lu_3Al_5O_{12}:Ce^{3+}$) having a peak wavelength of 520 nm at 73.4 wt %, and a third phosphor ($CaAlSiN_3$) having a peak wavelength of 650 nm at 16.1 wt % into the sealing material. A ratio of the first phosphor to the second phosphor was 1:7.

Figures 7, 8:
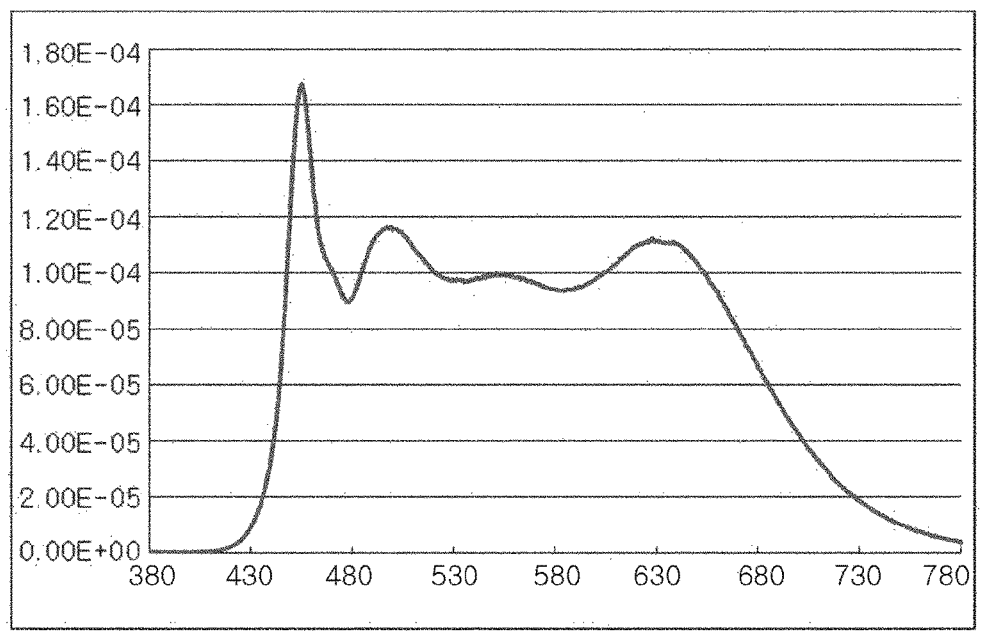
FIG. 7 is a table of measured values of color coordinates and CRI of the mixed light according to the third embodiment.
FIG. 8 is a graph showing an excitation spectrum of mixed light according to a fourth embodiment.

A spectrum of light of the manufactured white LED is illustrated in FIG. 6, and a CRI evaluation table is illustrated FIG. 7. Referring to FIG. 7, all CRI values of R1 to R15 were 80 or more, and a value of R12 was highly increased to 99.

Fourth Embodiment

A compound phosphor at 13.3 wt % and a sealing material at 86.7 wt % were mixed and coated on a blue LED chip with a size of 1000 μm×500 μm and a peak wavelength of 456.5 nm. The compound phosphor was manufactured by mixing a first phosphor ($BaSi_2O_2N_2:Eu^{2+}$) having a peak wavelength of 497 nm at 9.5 wt %, a second phosphor ($Lu_3Al_5O_{12}:Ce^{3+}$) having a peak wavelength of 520 nm at 76.0 wt %, a third phosphor ($CaAlSiN_3$) having a peak wavelength of 650 nm at 14.5 wt % into the sealing material. Here, a ratio of the first phosphor to the second phosphor was 1:8.

Figures 9, 10:
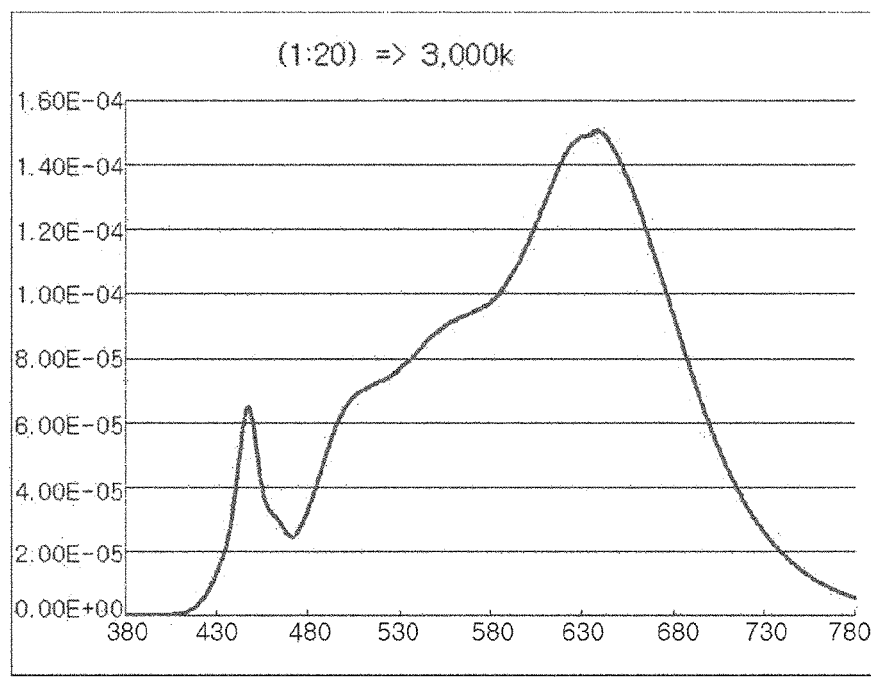
FIG. 9 is a table of measured values of color coordinates and CRI of the mixed light according to the fourth embodiment.
FIG. 10 is a graph showing an excitation spectrum of mixed light according to a fifth embodiment.

A spectrum of light emitted from the manufactured white LED is illustrated in FIG. 8, and a CRI evaluation table is illustrated in FIG. 9.

Fifth Embodiment

A compound phosphor at 18.9 wt % and a sealing material at 81.1 wt % were mixed and coated on a blue LED chip with a size of 1000 μm×500 μm and a peak wavelength of 448.7 nm. The compound phosphor was manufactured by mixing a first phosphor ($BaSi_2O_2N_2:Eu^{2+}$) having a peak wavelength of 497 nm at 3.9 wt %, a second phosphor ($Lu_3Al_5O_{12}:Ce^{3+}$) having a peak wavelength of 520 nm at 77.3 wt %, and a third phosphor ($CaAlSiN_3$) having a peak wavelength of 650 nm at 18.9 wt % into the sealing material. Here, a ratio of the first phosphor to the second phosphor was 1:20, and the experiment was performed with a color temperature of 3000 k.

Figures 11, 12:
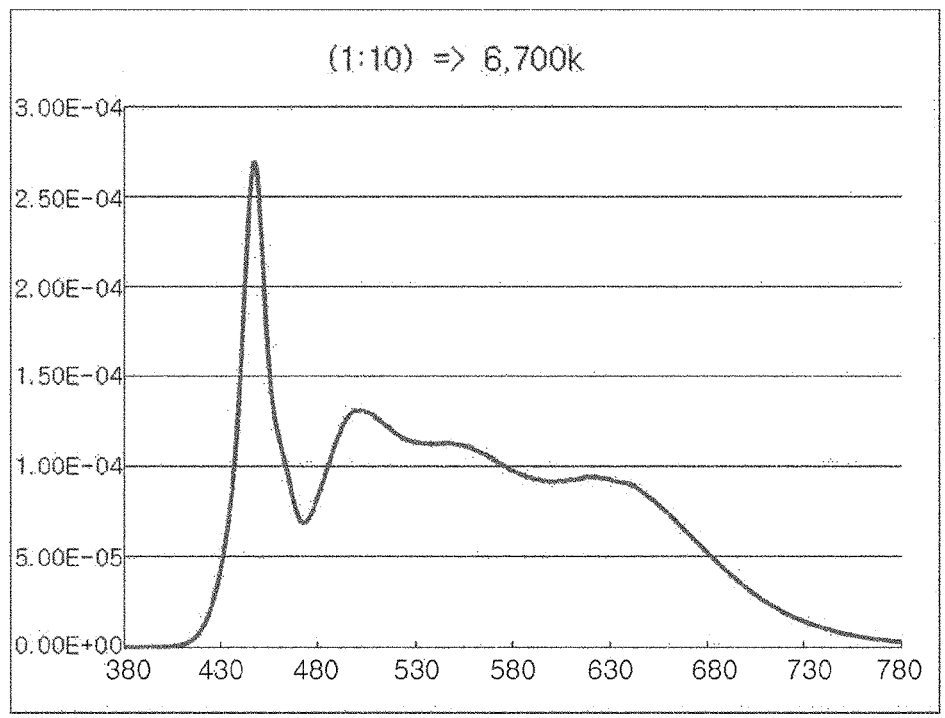
FIG. 11 is a table of measured values of color coordinates and CRI of the mixed light according to the fifth embodiment.
FIG. 12 is a graph showing an excitation spectrum of mixed light according to a sixth embodiment.

A spectrum of light of the manufactured white LED is illustrated in FIG. 10, and a CRI evaluation table is illustrated FIG. 11.

Sixth Embodiment

A compound phosphor at 9.8 wt % and a sealing material at 90.2 wt % were mixed and coated on a blue LED chip with a size of 1000 μm×500 μm and a peak wavelength of 448.7 nm. The compound phosphor was manufactured by mixing a first phosphor ($BaSi_2O_2N_2:Eu^{2+}$) having a peak wavelength of 497 nm at 7.9 wt %, a second phosphor ($Lu_3Al_5O_{12}:Ce^{3+}$) having a peak wavelength of 520 nm at 79.1 wt %, and a third phosphor ($CaAlSiN_3$) having a peak wavelength of 650 nm at 13.0 wt % into the sealing material. Here, a ratio of the first phosphor to the second phosphor was 1:10, and the experiment was performed with a color temperature of 6700 k.

Figures 13, 14:
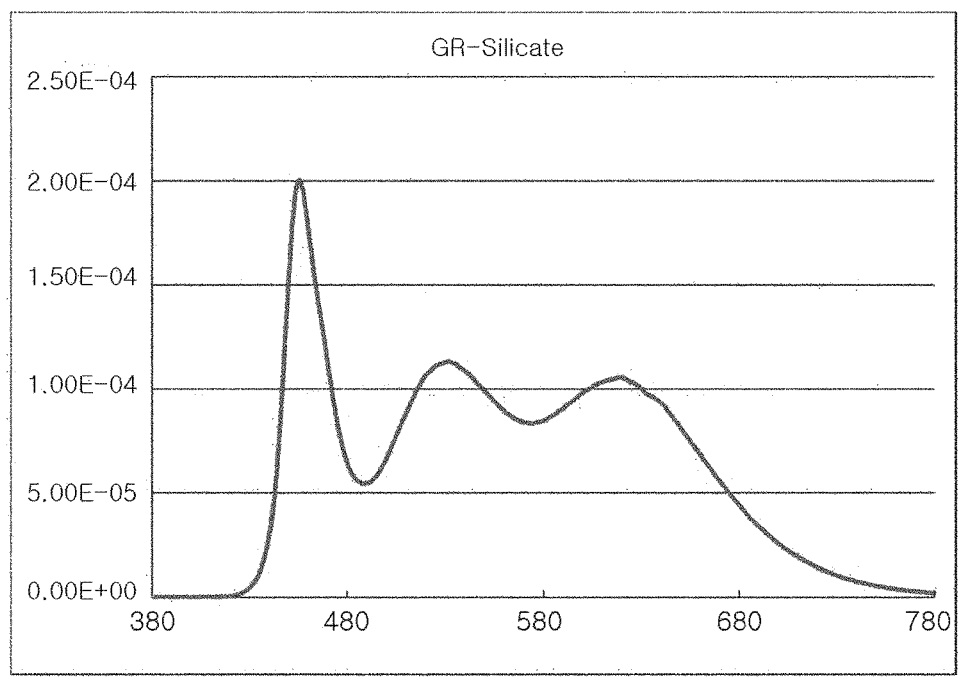
FIG. 13 is a table of measured values of color coordinates and CRI of the mixed light according to the sixth embodiment.
FIG. 14 is a graph showing an excitation spectrum of mixed light according to Comparative Example 1.

A spectrum of light emitted from the manufactured white LED is illustrated in FIG. 12, and a CRI evaluation table is illustrated in FIG. 13.

Comparative Example 1

A compound phosphor at 13.7 wt % and a sealing material at 86.3 wt % were mixed and coated on a blue LED chip with a size of 1000 μm×500 μm and a peak wavelength of 456 nm. The compound phosphor is manufactured by mixing $(Sr, Ba)_2SiO_4:Eu$ with a peak wavelength of 517 nm at 88.0 wt %, and $(Si, Ca)AlSiN_3$: Eu with a peak wavelength of 630 nm at 12.0 wt % into the sealing material. A spectrum of light of the manufactured white LED is illustrated in FIG. 14, and a CRI evaluation table is illustrated FIG. 15.

Comparative Example 2

Figures 15, 16:
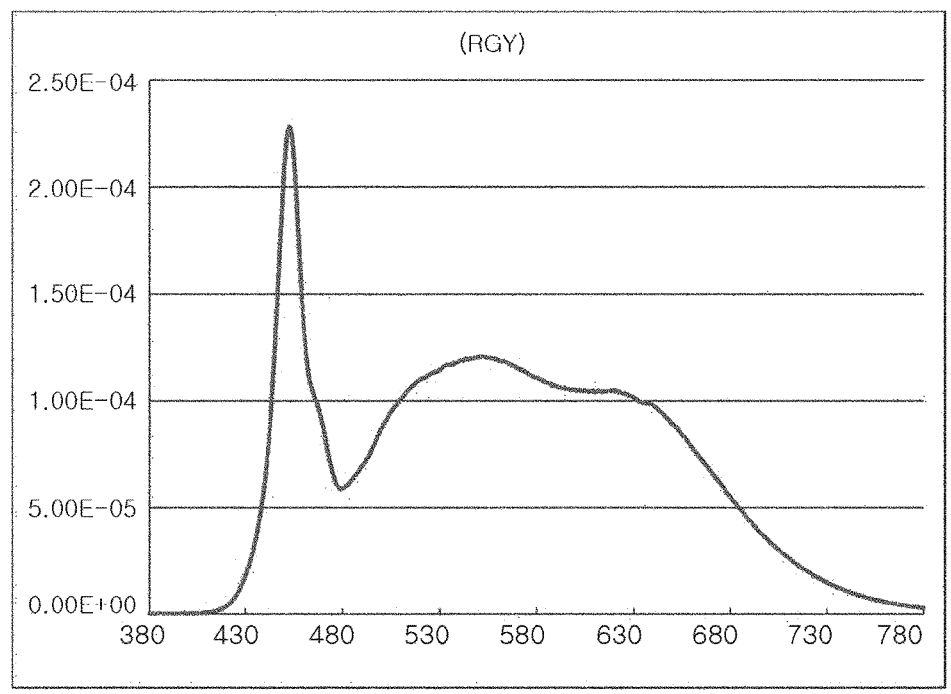
FIG. 15 is a table of measured values of color coordinates and CRI of the mixed light according to Comparative Example 1.
FIG. 16 is a graph showing an excitation spectrum of mixed light according to Comparative Example 2.

A compound phosphor at 11.8 wt % and a sealing material at 88.2 wt % were mixed and coated on a blue LED chip with a size of 1000 μm×500 μkm and a peak wavelength of 453.8 nm. The compound phosphor was manufactured by mixing $Lu_3Al_5O_{12}$: $Ce^{3+}$ with a peak wavelength of 520 nm at 69.3 wt %, $Y_3Al_5O_{12}$: $Ce^{3+}$ with a peak wavelength of 546 nm at 17.3 wt %, and $CaAlSiN_3$ with a peak wavelength of 650 nm at 13.3 wt % into the sealing material. A spectrum of light of the manufactured white LED is illustrated in FIG. 16, and a CRI evaluation table is illustrated FIG. 17.

Comparative Example 3

Figures 17, 18:
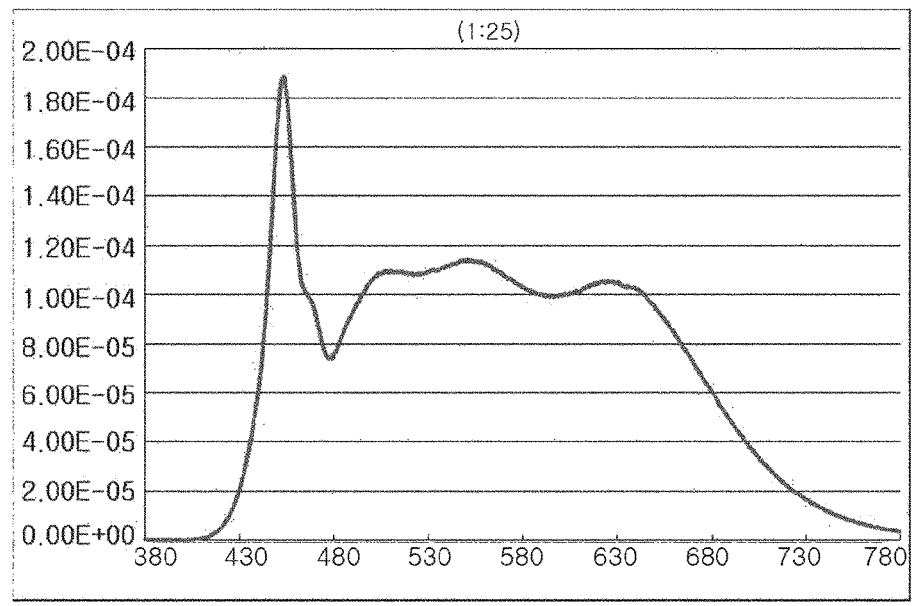
FIG. 17 is a table of measured values of color coordinates and CRI of the mixed light according to Comparative Example 2.
FIG. 18 is a graph showing an excitation spectrum of mixed light according to Comparative Example 3.

A compound phosphor at 12.0 wt % and a sealing material at 88.0 wt % were mixed and coated on a blue LED chip with a size of 1000 μm×500 μm and a peak wavelength of 454.1 nm. The compound phosphor was manufactured by mixing a first phosphor $(BaSi_2O_2N_2:Eu^{2+})$ having a peak wavelength of 497 nm at 3.3 wt %, a second phosphor $(Lu_3Al_5O_{12}:Ce^{3+})$ having a peak wavelength of 520 nm at 83.3 wt %, and a third phosphor $(CaAlSiN_3)$ having a peak wavelength of 650 nm at 6.7 wt % into the sealing material. A spectrum of light of the manufactured white LED is illustrated in FIG. 18, and a CRI evaluation table is illustrated FIG. 19.

Comparative Example 4

Figures 19, 20:
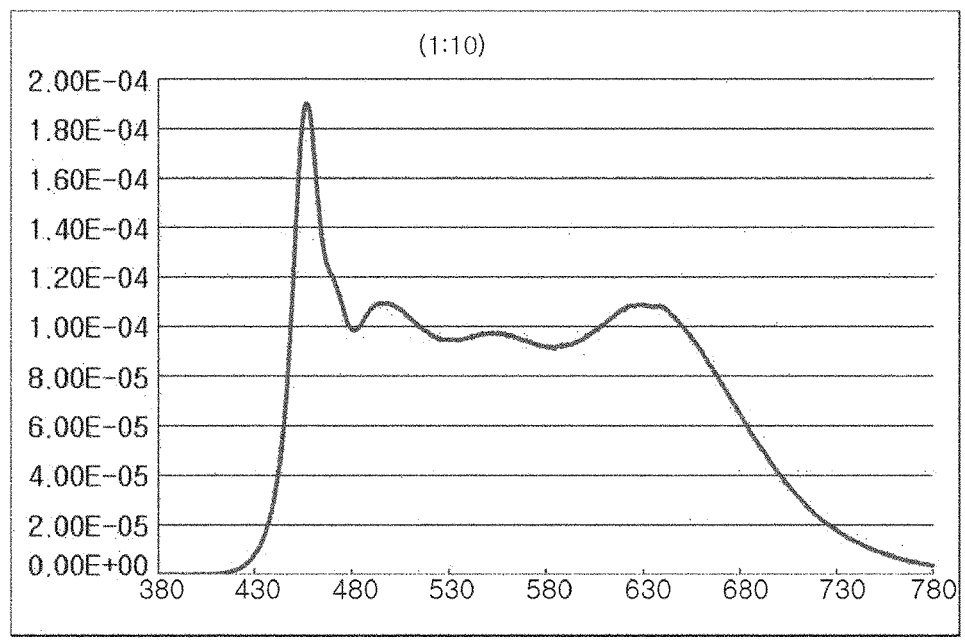
FIG. 19 is a table of measured values of color coordinates and CRI of the mixed light according to Comparative Example 3.
FIG. 20 is a graph showing an excitation spectrum of mixed light according to Comparative Example 4.
Figures 21, 22:
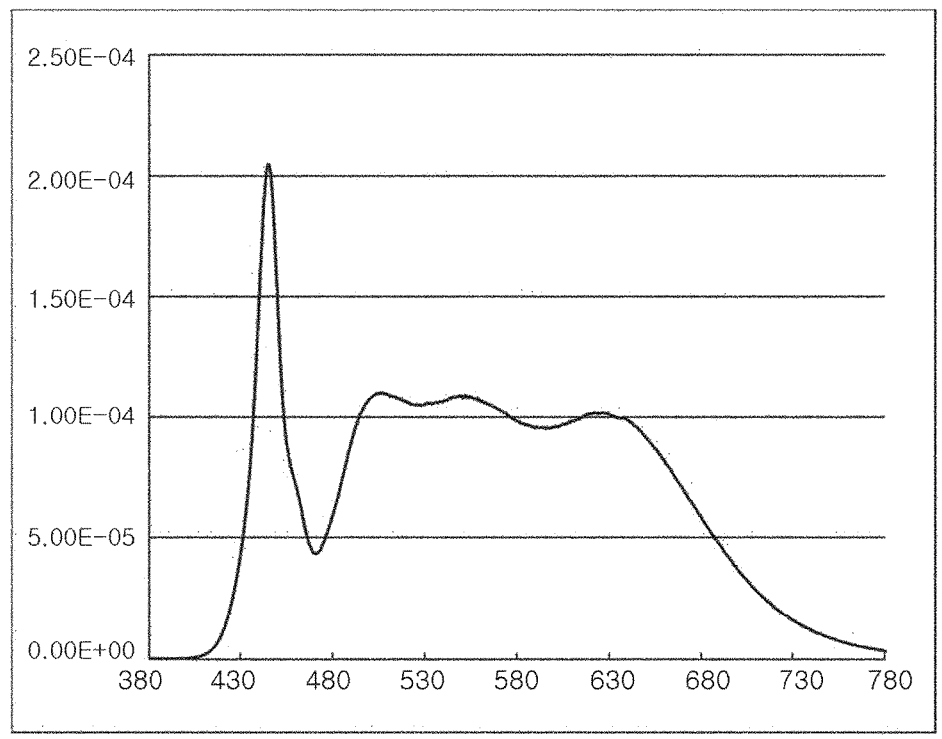
FIG. 21 is a table of measured values of color coordinates and CRI of the mixed light according to Comparative Example 4.
FIG. 22 is a graph showing an excitation spectrum of mixed light according to according to a seventh embodiment.

A compound phosphor at 13.3 wt % and a sealing material at 86.7 wt % were mixed and coated on a blue LED chip with a size of 1000 μm×500 μm and a peak wavelength of 457.8 nm. The compound phosphor was manufactured by mixing a first phosphor $(BaSi_2O_2N_2: Eu^{2+})$ having a peak wavelength of 497 nm at 7.8 wt %, a second phosphor $(Lu_3Al_5O_{12}: Ce^{3+})$ having a peak wavelength of 520 nm at 77.7 wt %, and a third phosphor $(CaAlSiN_3)$ having a peak wavelength of 650 nm at 14.5 wt % into the sealing material. A spectrum of light emitted from the manufactured white LED is illustrated in FIG. 20, and a CRI evaluation table is illustrated in FIG. 21.

The following table arranges CRI values of R12 according to a chip wavelength and a weight percent (wt %) of a phosphor of the above-described embodiments and comparative examples.

TABLE 1

| | Chip Wavelength (nm) | First Phosphor (wt %) | Second Phosphor (wt %) | Third Phosphor (wt %) | First Phosphor/Second Phosphor | CRI R12 |
|---|---|---|---|---|---|---|
| First Embodiment | 446.3 | 5.4 | 80.7 | 6.9 | 1:14 | 85 |
| Second Embodiment | 446.3 | 7.7 | 76.9 | 15.4 | 1:9.98 | 90 |
| Third Embodiment | 446.9 | 10.5 | 73.4 | 16.1 | 1:6.99 | 99 |
| Fourth Embodiment | 456.5 | 9.5 | 76.0 | 14.5 | 1:8 | 80 |
| Fifth Embodiment | 448.7 | 3.9 | 77.3 | 18.9 | 1:19 | 97 |
| Sixth Embodiment | 448.7 | 7.9 | 79.1 | 13.0 | 1:10 | 81 |
| Comparative example 1 | 456.0 | — | 88.0 | 12.0 | — | 67 |
| Comparative Example 2 | 453.8 | 69.3 | 17.3 | 13.3 | — | 66 |
| Comparative Example 3 | 454.1 | 3.3 | 83.3 | 6.7 | 1:25 | 75 |
| Comparative Example 4 | 457.8 | 7.8 | 77.7 | 14.5 | 1:10 | 78 |

Referring to FIGS. 2 to 21, and Table 1, it can be confirmed that each of the first embodiments 1 to 6 had a general CRI value and a special CRI value of 80 or more, and particularly, R12 was measured to have values of 80 or more, and thus an intensity of blue was increased. Accordingly, when the ratio of the first phosphor to the second phosphor is adjusted in the range of 1:7 to 1:15, a sense of blue may be increased when a white LED is used as a light.

Furthermore, it can be seen that when the ratio of the first phosphor to the second phosphor is adjusted in the range of 1:7 to 1:10, a value of R12 may be increased to 90 or more. In the case of the sixth embodiment, although the value of R12 is decreased compared to that of the fifth embodiment, the reason is that a color temperature of the fifth embodiment was 3000K and that of the sixth embodiment was 6700K. Accordingly, it can be seen that when the ratio of the first phosphor to the second phosphor is adjusted in the range of 1:7 to 1:10, the value of R12 may also be increased to 80 or more even when a color temperature is 6700K.

In the case of the fourth embodiment, it can be seen that a value of R12 may also be maintained at 80 or more when a chip has a long wavelength (456.5 nm). Accordingly, it can be seen that when the ratio of the first phosphor to the second phosphor is adjusted in the range of 1:7 to 1:8, the value of R12 may be maintained at 80 or more even when any one of a short wavelength LED chip and the long wavelength LED chip is used.

In case of Comparative Example 1, it can be seen that as only a conventional green phosphor and a red phosphor are used, a value of R12 is low at 67. As can be seen in FIG. 15, even in the case of Comparative Example 1, it can be seen that although white light is generated and the CRI value is excellent at 96, but the value of R12 is relatively low at 67.

In the case of Comparative Examples 3 and 4, it can be seen that as the same phosphors having similar contents as that of the fifth embodiment are used, values of R12 are very low. According to such a result, it can be seen that a content of the first phosphor has to become higher as a peak wavelength of a blue LED is increased (as the wavelength becomes longer).

As an example, in the case of the fourth embodiment, it can be seen that although a peak wavelength of the LED chip, which is 456.5 nm, is similar to that of Comparative Examples 3 and 4, a value of R12 is increased because content of the first phosphor is high at 9.5 wt %.

Accordingly, it can be seen that when the mass ratio of the first phosphor to the second phosphor is controlled in the range of 1:7 to 1:8, the value of R12 is maintained at 80 or more in an entire wavelength band of the blue LED chip (approximately in the range of 420 to 460 nm).

The inventor confirmed that a suitable range of the first phosphor and the second phosphor was changed according to a wavelength band of a blue LED chip through the above experiments. Accordingly, additional experiments were performed by varying a ratio of a first phosphor to a second phosphor according to a wavelength band of a blue LED chip.

[Seventh Embodiment] Short Wavelength Chip

A compound phosphor at 12.5 wt % and a sealing material at 87.5 wt % were mixed and coated on a blue LED chip with a size of 1000 μm×500 μm and a dominant wavelength of 452 nm. The compound phosphor was manufactured by mixing a first phosphor ($BaSi_2O_2N_2$: $Eu^{2+}$) having a peak wavelength of 497 nm at 0.68 wt %, a second phosphor ($Lu_3Al_5O_{12}$: $Ce^{3+}$) having a peak wavelength of 520 nm at 10.1 wt %, and a third phosphor ($CaAlSiN_3$) having a peak wavelength of 650 nm at 1.72 wt % into the sealing material. Here, a ratio of the first phosphor to the second phosphor was 1:15.

Figures 23, 24:
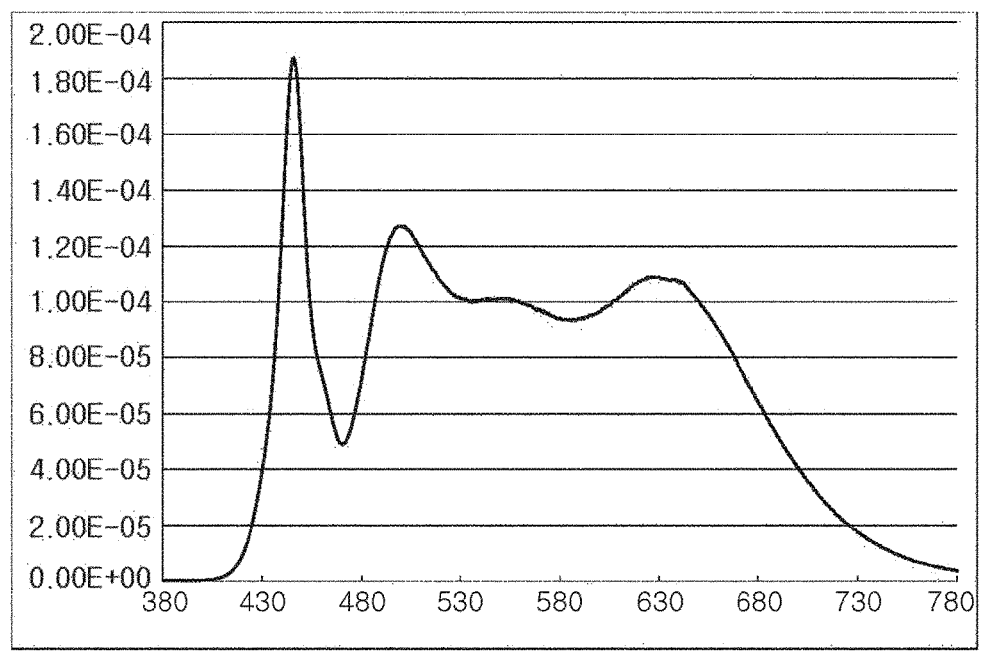
FIG. 23 is a table of measured values of color coordinates and CRI the mixed light according to the seventh embodiment.
FIG. 24 is a graph showing an excitation spectrum of mixed light according to according to an eighth embodiment.

A spectrum of light emitted from the manufactured white LED is illustrated in FIG. 22, and a CRI evaluation table is illustrated in FIG. 23.

[Eighth Embodiment] Short Wavelength Chip

A compound phosphor was formed of a first phosphor at 1.46 wt %, a second phosphor at 1.2 wt %, and a third phosphor at 2.24 wt %, a ratio of the first phosphor to the second phosphor was 1:7, and except for that everything else was the same as the seventh embodiment.

Figures 25, 26:
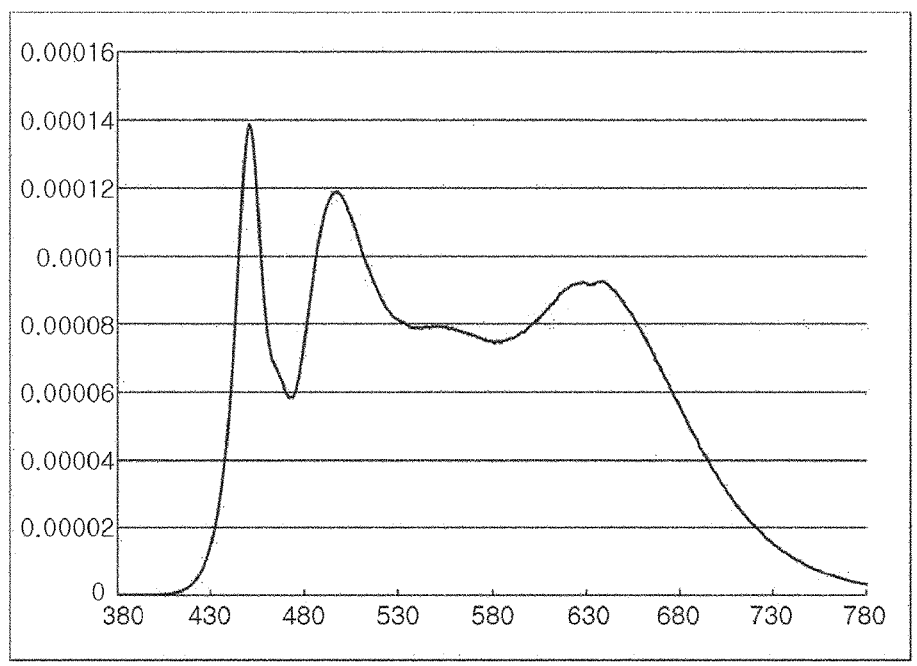
FIG. 25 is a table of measured values of color coordinates and CRI the mixed light according to the eighth embodiment.
FIG. 26 is a graph showing an excitation spectrum of mixed light according to according to a ninth embodiment.

A spectrum of light emitted from the manufactured white LED is illustrated in FIG. 24, and a CRI evaluation table is illustrated in FIG. 25.

[Ninth Embodiment] Short Wavelength Chip

A compound phosphor was formed of a first phosphor at 2.5 wt %, a second phosphor at 10.1 wt %, and a third phosphor at 2.1 wt %, a ratio of the first phosphor to the second phosphor was 1:4, and except for that everything else was the same as the seventh embodiment.

Figures 27, 28:
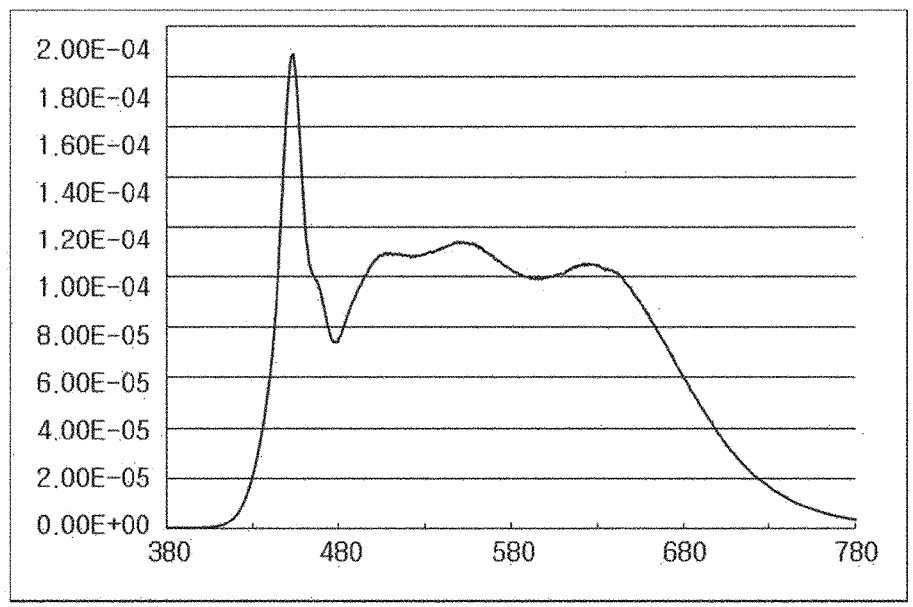
FIG. 27 is a table of measured values of color coordinates and CRI the mixed light according to the ninth embodiment.
FIG. 28 is a graph showing an excitation spectrum of mixed light according to Comparative Example 5.

A spectrum of light emitted from the manufactured white LED is illustrated in FIG. 26, and a CRI evaluation table is illustrated in FIG. 27.

[Comparative Example 5] Short Wavelength Chip

A compound phosphor was formed of a first phosphor at 0.4 wt %, a second phosphor at 10.0 wt %, and a third phosphor at 1.6 wt %, a ratio of the first phosphor to the second phosphor was 1:25, and except for that everything else was the same as the seventh embodiment.

Figures 29, 30:
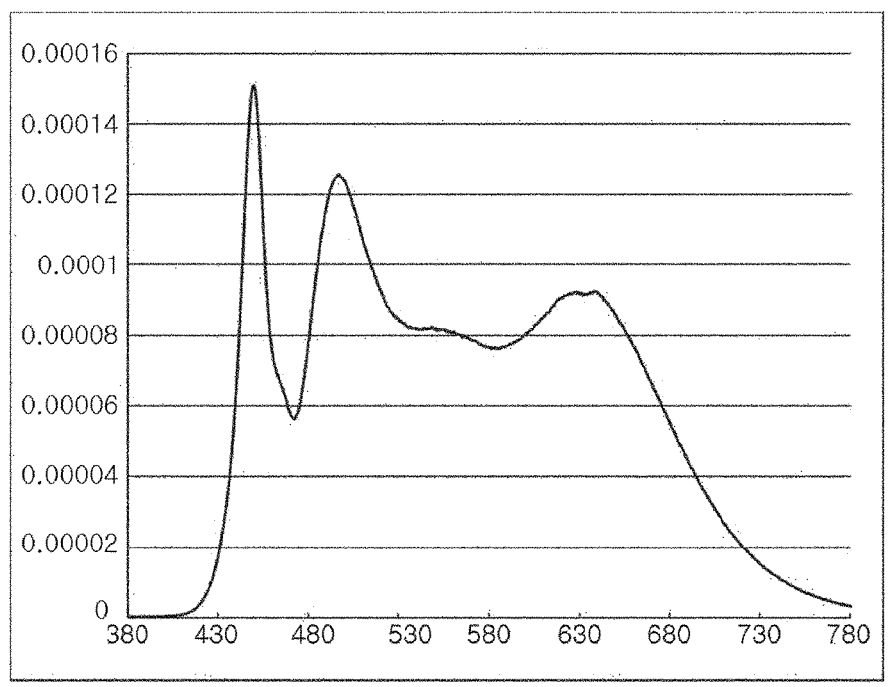
FIG. 29 is a table of measured values of color coordinates and CRI of the mixed light according to Comparative Example 5.
FIG. 30 is a graph showing an excitation spectrum of mixed light according to Comparative Example 6.

A spectrum of light emitted from the manufactured white LED is illustrated in FIG. 28, and a CRI evaluation table is illustrated in FIG. 29.

[Comparative Example 6] Short Wavelength Chip

A compound phosphor was formed of a first phosphor at 3.3 wt %, a second phosphor at 9.8 wt %, and a third phosphor at 2.3 wt %, a ratio of the first phosphor to the second phosphor was 1:3, and except for that everything else was the same as the seventh embodiment.

Figures 31, 32:
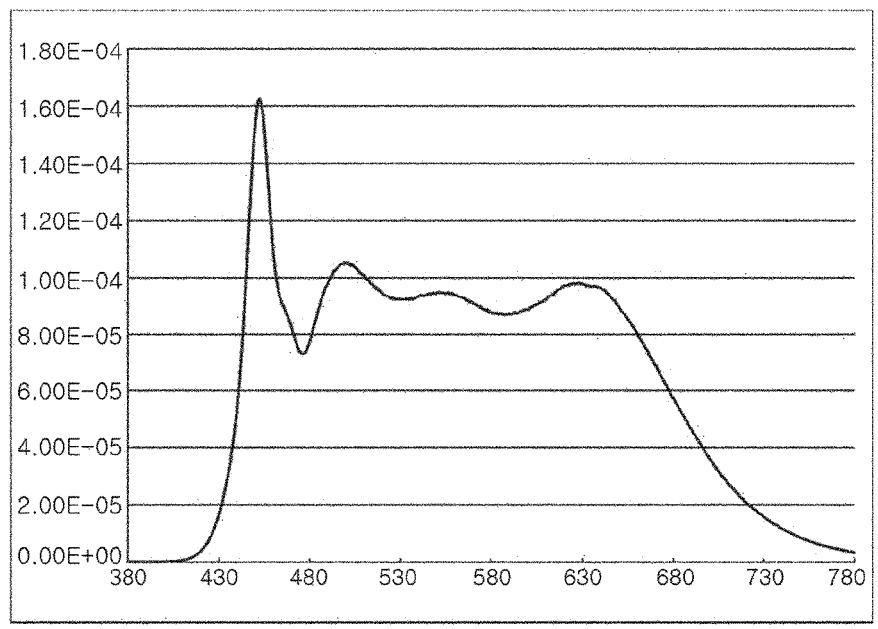
FIG. 31 is a table of measured values of color coordinates and CRI of the mixed light according to Comparative Example 6.
FIG. 32 is a graph showing an excitation spectrum of mixed light according to according to a tenth embodiment.

A spectrum of light emitted from the manufactured white LED is illustrated in FIG. 30, and a CRI evaluation table is illustrated in FIG. 31.

[Tenth Embodiment] Long Wavelength Chip

A compound phosphor at 11.2 wt % and a sealing material at 88.8 wt % were mixed and coated on a blue LED chip with a size of 1000 μm×500 μm and a dominant wavelength of 457 nm. The compound phosphor was manufactured by mixing a first phosphor ($BaSi_2O_2N_2$: $Eu^{2+}$) having a peak wavelength of 497 nm at 1.1 wt %, a second phosphor ($Lu_3Al_5O_{12}$: $Ce^{3+}$) having a peak wavelength of 520 nm at 8.8 wt %, and a third phosphor ($CaAlSiN_3$) having a peak wavelength of 650 nm at 1.3 wt % into the sealing material. Here, a ratio of the first phosphor to the second phosphor was 1:8.

Figures 33, 34:
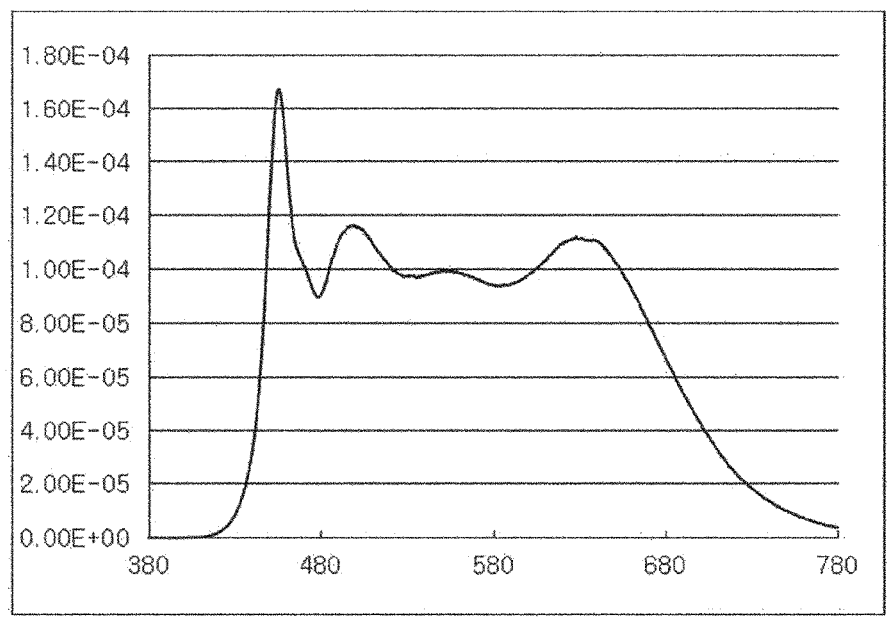
FIG. 33 is a table of measured values of color coordinates and CRI of the mixed light according to the tenth embodiment.
FIG. 34 is a graph showing an excitation spectrum of mixed light according to an eleventh embodiment.

A spectrum of light emitted from the manufactured white LED is illustrated in FIG. 32, and a CRI evaluation table is illustrated in FIG. 33.

[Eleventh Embodiment] Long Wavelength Chip

A compound phosphor was formed of a first phosphor at 1.3 wt %, a second phosphor at 8.8 wt %, and a third phosphor at 1.7 wt %, a ratio of the first phosphor to the second phosphor was 1:7, and except for that everything else was the same as the tenth embodiment.

Figures 35, 36:
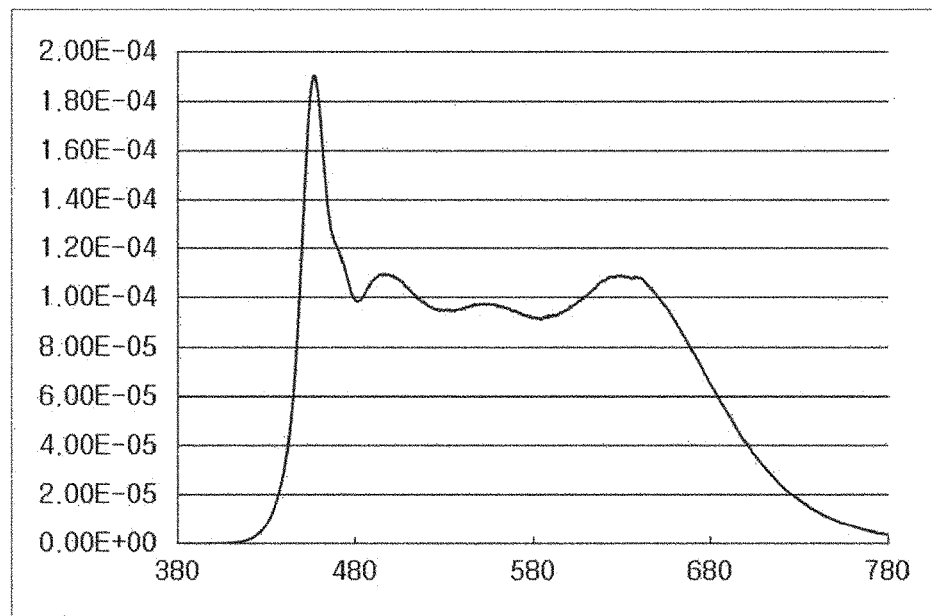
FIG. 35 is a table of measured values of color coordinates and CRI of the mixed light according to the eleventh embodiment.
FIG. 36 is a graph showing an excitation spectrum of mixed light according to Comparative Example 7.

A spectrum of light emitted from the manufactured white LED is illustrated in FIG. 34, and a CRI evaluation table is illustrated in FIG. 35.

[Comparative Example 7] Long Wavelength Chip

A compound phosphor was formed of a first phosphor at 0.85 wt %, a second phosphor at 8.5 wt %, and a third phosphor at 1.05 wt %, a ratio of the first phosphor to the second phosphor was 1:10, and except for that everything else was the same as the tenth embodiment.

Figures 37, 38:
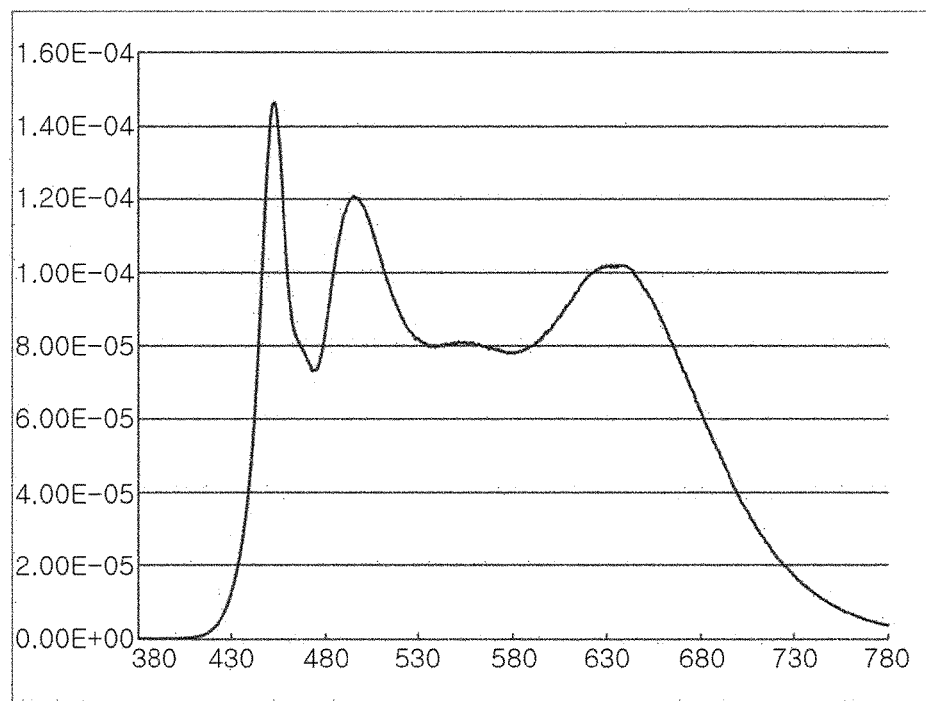
FIG. 37 is a table of measured values of color coordinates and CRI of the mixed light according to Comparative Example 7.
FIG. 38 is a graph showing an excitation spectrum of mixed light according to Comparative Example 8.

A spectrum of light emitted from the manufactured white LED is illustrated in FIG. 36, and a CRI evaluation table is illustrated in FIG. 37.

[Comparative Example 8] Long Wavelength Chip

A compound phosphor was formed of a first phosphor at 2.6 wt %, a second phosphor at 7.9 wt %, and a third phosphor at 1.9 wt %, a ratio of the first phosphor to the second phosphor was 1:3, and except for that everything else was the same as the tenth Embodiment.

A spectrum of light emitted from the manufactured white LED is illustrated in FIG. 38, and a CRI evaluation table is illustrated in FIG. 39.

The following Table 2 is a table which arranges CRI values of R12 according to a chip wavelength and a wt % of a phosphor of above-described embodiments and comparative examples.

TABLE 2

| | Chip Wavelength nm | First Phosphor wt % | Second Phosphor wt % | Third Phosphor wt % | First Phosphor/Second Phosphor | CRI R12 |
|---|---|---|---|---|---|---|
| Seventh Embodiment | 452 | 0.68 | 10.1 | 1.72 | 1:15 | 85 |
| Eighth Embodiment | 452 | 1.46 | 10.2 | 2.24 | 1:7 | 99 |
| Ninth Embodiment | 452 | 2.5 | 10.1 | 2.1 | 1:4 | 88 |
| Tenth Embodiment | 457 | 1.1 | 8.8 | 1.3 | 1:8 | 80 |
| Eleventh Embodiment | 457 | 1.3 | 8.8 | 1.7 | 1:7 | 82.7 |
| Comparative Example 5 | 452 | 0.4 | 10.0 | 1.6 | 1:25 | 75 |
| Comparative Example 6 | 452 | 3.3 | 9.8 | 2.3 | 1:3 | 87 |
| Comparative Example 7 | 457 | 0.85 | 8.5 | 1.05 | 1:10 | 78 |
| Comparative Example 8 | 457 | 2.6 | 7.9 | 1.9 | 1:3 | 79.4 |

Referring to Table 2, it can be seen that when a dominant wavelength of a chip is a short wavelength of 452 nm, and the ratio of the first phosphor to the second phosphor is in the range of 1:4 to 1:15, CRI values are maintained at 80 or more, and values of R12 are also maintained at 80 or more. Particularly, it can be seen that when the ratio of the first phosphor to the second phosphor is 1:7, R12 becomes very excellent with a value of 99.

On the contrary, it can be seen that when the ratio of the first phosphor to the second phosphor is 1:25 as in Comparative Example 5, a value of R12 is decreased to under 80, and a sense of blue is lowered. In addition, when the ratio of the first phosphor and the second phosphor is 1:25, although the value of R12 is relatively high at 87, values of R9 and R10 are decreased to under 80, and thus there is a problem in that the special CRI value is decreased.

It can be seen that when a dominant wavelength of a chip is a long wavelength of 457 nm and the ratio of the first phosphor to the second phosphor is in the range of 1:7 to 1:8, the CRI value may be maintained at 80 or more. However, it can be confirmed that when the ratio of the first phosphor and the second phosphor is greater than 1:10 or less than 1:3, the value of R12 is decreased to under 80.

According to such a result, it can be seen that when the ratio of the first phosphor to the second phosphor is adjusted in the range of 1:7 to 1:8, the general CRI and the special CRI may be maintained at 80 or more regardless of a short wavelength chip or a long wavelength chip, and particularly the value of R12 may be increased to 80 or more.

What is claimed is:

1. A light emitting device comprising:
a light emitting element which emits a first light beam having a blue wavelength band;
a first wavelength converter which converts the first light beam to a second light beam;
a second wavelength converter which converts the first light beam to a third light beam; and
a third wavelength converter which converts the first light beam to a fourth light beam,
wherein the first light beam has a central wavelength in a range of 446 nm to 454 nm, or in a range of 455 nm to 460 nm,
wherein the second light beam has a central wavelength in a range of 480 nm to 500 nm,
wherein the third light beam has a central wavelength in a range of 510 nm to 550 nm,
wherein the first to the fourth light beams are mixed to form a white light,
wherein the second wavelength converter includes $Lu_3Al_5O_{12}:Ce^{3+}$, and
wherein
when the central wavelength of the first light beam is in the range of 446 nm to 454 nm,
a first weight ratio of the first wavelength converter to the second wavelength converter is in a range of 1:4 to 1:15, and
a second weight ratio of the first wavelength converter to the third wavelength converter is in a range of 1:0.84 to 1:4.84, the first weight ratio being larger than the second weight ratio, and
when the central wavelength of the first light beam is in the range of 455 nm to 460 nm,
a third weight ratio of the first wavelength converter to the second wavelength converter is in a range of 1:7 to 1:8, and
a fourth weight ratio of the first wavelength converter to the third wavelength converter is in a range of 1:1.18 to 1:1.52, the third weight ratio being larger than the fourth weight ratio.

2. The light emitting device of claim 1, wherein the white light is emitted by the light emitting device, and a color rendering index (CRI) value of R12 thereof is at least 80.

3. The light emitting device of claim 1, wherein the first wavelength converter is expressed with

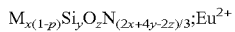

wherein
M is at least one element selected from Ca, Sr, and Ba,
x is in a range of 0.7 to 1.2,
y is in a range of 1.5 to 2.6,
z is in a range of 1.5 to 2.6, and
p is in a range of 0 to 0.11.

4. The light emitting device of claim 1, wherein when the central wavelength of the first light beam is in the range of 446 nm to 454 nm, the first weight ratio of the first wavelength converter to the second wavelength converter is in a range of 1:7 to 1:15.

5. The light emitting device of claim 1, wherein when the central wavelength of the first light beam is in the range of 446 nm to 454 nm, the first weight ratio of the first wavelength converter to the second wavelength converter is in a range of 1:7 to 1:10.

6. The light emitting device of claim 1, wherein when the central wavelength of the first light beam is in the range of 446 nm to 454 nm, the first weight ratio of the first wavelength converter to the second wavelength converter is in a range of 1:7 to 1:8.

\* \* \* \* \*